United States Patent
Lueders

(10) Patent No.: US 6,229,328 B1
(45) Date of Patent: *May 8, 2001

(54) INTEGRATED CIRCUIT WITH A TEST FUNCTION IMPLEMENTED BY CIRCUITRY WHICH IDENTIFIES THE PRESENCE OF A CONTROL SIGNAL

(75) Inventor: Ralf Lueders, Auenwald (DE)

(73) Assignee: Nokia Mobile Phones Ltd., Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/876,673

(22) Filed: Jun. 16, 1997

(30) Foreign Application Priority Data

Jun. 21, 1996 (DE) .............................. 196 24 858

(51) Int. Cl.[7] ..................................... G01R 31/26
(52) U.S. Cl. ........................................ 324/765; 324/763
(58) Field of Search .............................. 324/763, 765; 714/733, 734

(56) References Cited

U.S. PATENT DOCUMENTS

| 4,975,641 | * | 12/1990 | Tanaka et al. ...................... 324/763 |
| 5,019,772 | * | 5/1991 | Dreibelbis et al. .................. 324/763 |
| 5,490,235 | | 2/1996 | Von Holten et al. ............... 395/2.79 |
| 5,577,052 | * | 11/1996 | Morris ................................. 714/733 |
| 5,589,766 | * | 12/1996 | Frank et al. ...................... 324/158.1 |
| 5,603,103 | | 2/1997 | Halttunen et al. ................... 455/90 |
| 5,900,739 | * | 5/1999 | Gaglani ............................... 324/765 |

* cited by examiner

Primary Examiner—Safet Metjahic
Assistant Examiner—Russell M. Kobert
(74) Attorney, Agent, or Firm—Perman & Green, LLP

(57) ABSTRACT

Integrated circuit, having data inputs and outputs (Data(0), Data(1), Data(2), Data(3), DataO(0), DataO(1)), and a control input (ResetX) for receiving a first control signal for the purpose of switching the integrated circuit over between an operating state and a test state, characterized in that the integrated circuit has an identification circuit (5) which is connected to the control input (ResetX), distinguishes between the first control signal and a second control signal and switches the integrated circuit over between the operating state and the test state as a function of the first control signal.

18 Claims, 5 Drawing Sheets

INTEGRATED CIRCUIT WITH A TEST FUNCTION IMPLEMENTED BY CIRCUITRY WHICH IDENTIFIES THE PRESENCE OF A CONTROL SIGNAL

BACKGROUND OF THE INVENTION

This invention relates to an integrated circuit having data inputs and outputs and a control input which can switch the integrated circuit over between an operating state and a test state as a function of a control signal.

During ASIC (Application Specific Integrated Circuit) development, the manufacturer of an ASIC specifies a number of tests which the ASIC must satisfy. In order that these tests can be carried out, the ASIC must be switched to a test state in which the tests can be executed. In order that the ASIC has as few external terminals as possible, terminal pins for tests are combined with functional pins. In this way, a functional input or output pin can have the function of a test input or output pin. The state of the ASIC (operating state/test state) determines which function a pin has. In the normal operating state, the ASIC must never unintentionally be switched to the test state, and therefore the pin which switches the ASIC to the test state must not be shared. This switch-over is therefore performed by means of a separate test pin. This test pin is put at a fixed logic level during the normal operating state and at a different level during the test state. It can therefore no longer be used for the actual function of the ASIC.

FIG. 1 shows an ASIC which can be switched to a test state for a RAM test and a NAND tree test. In this ASIC, all of the data input pins Data (0) to Data (3) are each connected to a respective first input of a NAND of a NAND tree 4, to a first logic module 1 and to a respective input of a respective multiplexer of a multiplexer circuit 6, the second inputs of which are each connected to an output of the first logic module 1 and the outputs of which are each connected to an input of a RAM 3. The respective output of a NAND of the NAND tree 4 whose first input is connected to one of the data input pins is in each case connected to the second input of a further NAND, connected to an input pin, of the NAND tree 4. Like the data input pins Data (0) to Data (3), all of the further inputs of the integrated circuit are also connected to the NAND tree, whose output occupies a separate output pin of the integrated circuit. The output Dout of the RAM is connected to the input L2in of a logic module 2 and to an input of a multiplexer 7, the second input of which is connected to an output L2out of the logic module 2 and the output of which is connected to an output pin DataO (0). The logic modules 1 and 2 are supplied with a clock signal and a reset signal via input pins Clk and ResetX. The multiplexers are supplied, via an input pin TMin, with a signal TMode for switching over between the normal operating state and the test state.

Both a RAM test and a NAND tree test can be carried out in an integrated circuit constructed in this way. During the RAM test, all of the inputs and outputs of the ram are connected directly to input and output pins by the multiplexers present in the integrated circuit. As a result, the RAM can be tested independently of all the other assemblies present in the integrated circuit, by applying specific test patterns to the inputs and monitoring the output or outputs of the RAM in the process. The NAND tree test makes it possible to check whether the input or output pins connected to the NAND tree are actually connected to the integrated circuit. In order to test a specific input or output, all of the pins connected to the NAND tree are put at a specific potential, and the pin to be tested is switched over from this potential to a different potential. This switch-over can be observed at the output NAND-Treeout of the integrated circuit if the pin is actually connected to the integrated circuit. The response level of this tested pin can thus also be established as a function of the input level at which the output signal changes its level.

It may be asserted here that the implementation of these tests necessitates two pins which have no function in the operating state of the integrated circuit. These pins are the pin TMin for switching over to the test state and the pin NAND-Treeout, by means of which it is possible to establish the input level starting at which a specific pin of the integrated circuit responds. It is easy to see that these two pins are not dispensable, even though they are not required in the operating state of the integrated circuit. On the one hand, no other pin can assume the function of the input pin TMin, since all of the other input pins already have a function. On the other hand, unlike the output pin DataO (0), for example, the output pin NAND-Treeout cannot be multiplexed, since otherwise the input pin TMin for the switch-over signal TMode could not be checked by means of the NAND tree test.

SUMMARY OF THE INVENTION

The invention is therefore based on the object of specifying an integrated circuit which, for carrying out tests, does not require any pins which are not also required for the normal operating state.

This object is achieved in accordance with the invention wherein for the construction of an integrated circuit, having a plurality of data inputs and outputs, and wherein the integrated circuit operates with a control input (ResetX) for receiving a first control signal for the purpose of switching the integrated circuit over between an operating state and a test state, the invention is characterized in that the integrated circuit has an identification circuit which is connected to the control input (ResetX), and distinguishes between the first control signal and a second control signal and switches the integrated circuit over between the operating state and the test state as a function of the first control signal.

According to the invention, an integrated circuit having data inputs and outputs and a control input for receiving a first control signal for the purpose of switching the integrated circuit over between an operating state and a test state is characterized in that the integrated circuit has an identification circuit, which is connected to the control input, distinguishes between the first control signal and a second control signal and switches the integrated circuit over between the operating state and the test state as a function of the first control signal.

An integrated circuit constructed in this way can be switched to the test state without any additional pins, and it is possible to connect the output pins in such a way that the output NAND-Treeout, by means of which it is possible to establish how high the input potential of a respective input pin is, can also be multiplexed. With an integrated circuit which is constructed in this way, all of the pins which were necessary only for the purpose of testing can be dispensed with.

An advantageous development of the integrated circuit according to the invention is characterized in that the control input is a reset input and the second control signal comprises information about setting and resetting circuit blocks of the integrated circuit.

An integrated circuit which is constructed in this way has the advantage that the test state cannot be attained during normal operation if the reset pin is fundamentally at a constant potential after a reset and the identification circuit is an automatic state machine which switches to the test state in the event of a quite specific serial bit pattern at the reset pin.

Another development according to the invention of the integrated circuit is characterized in that the automatic state machine used as the identification circuit receives a system clock signal.

By also using a system clock signal for the respective transitions of the automatic state machine from one state to a next state, the output NAND-Treeout can be multiplexed, since, given a constant system clock signal, the automatic state machine does not change its state even when its input signal changes.

BRIEF DESCRIPTION OF THE DRAWING

Further details, features and advantages of the invention emerge from the following description of an exemplary embodiment with reference to the drawings, in which.

DETAILED DESCRIPTION OF THE INVENTION

Figure 1:
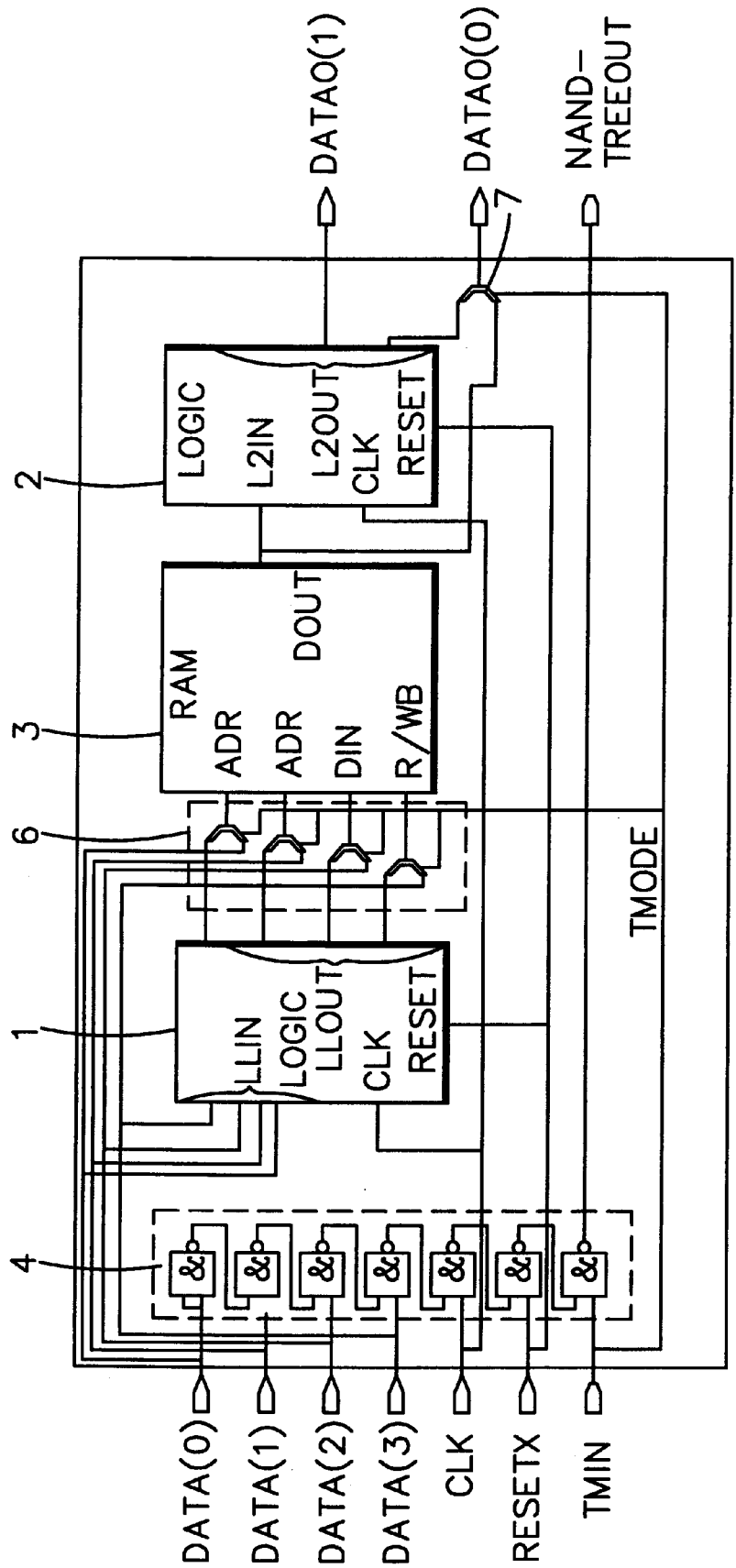
FIG. 1 shows the block diagram of an embodiment of an ASIC according to the prior art.
Figure 2:
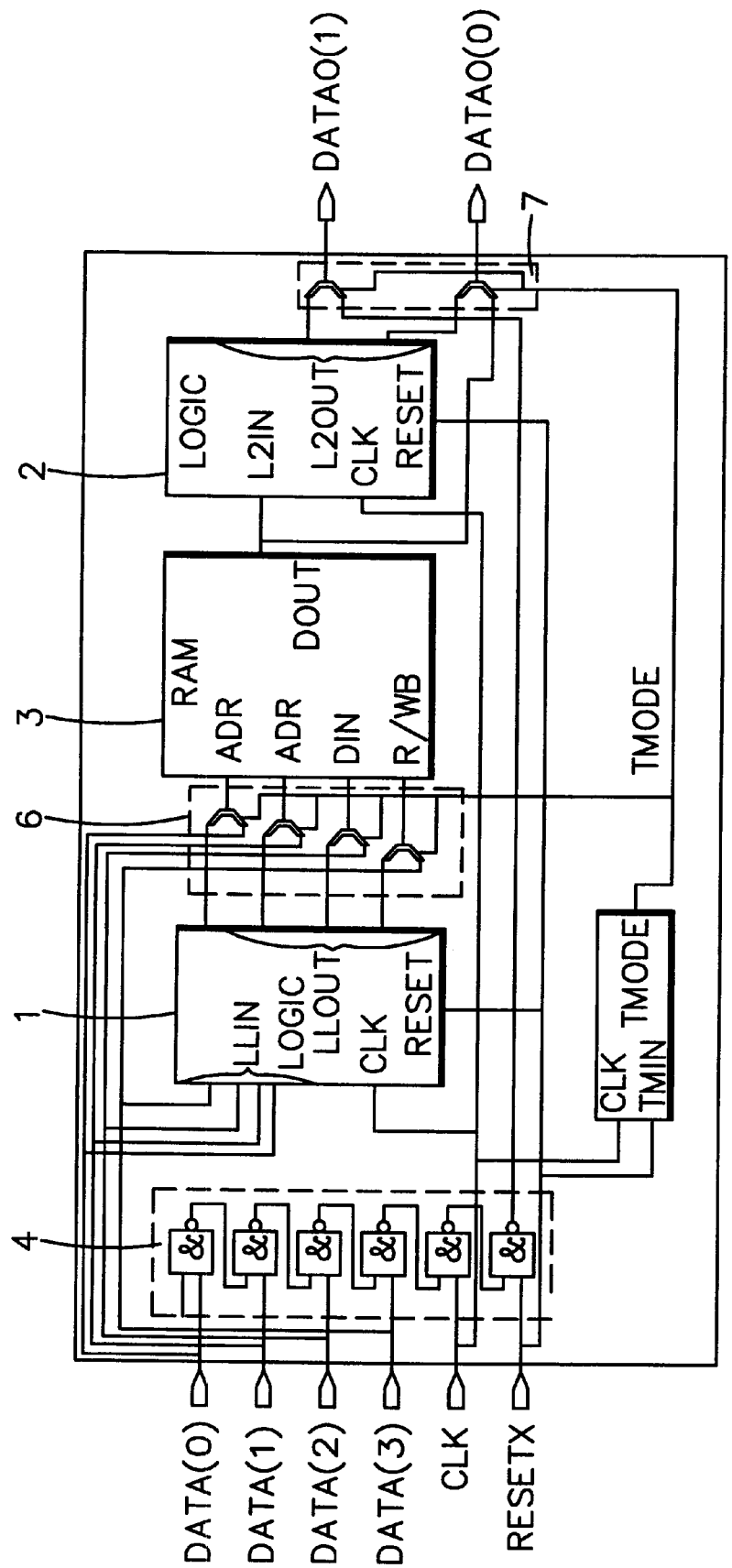
FIG. 2 shows a block diagram of an exemplary embodiment of an ASIC according to the invention.

The ASIC constructed according to the invention and shown in FIG. 2 has four data inputs Data (0) to Data (3), a system clock input Clk, a reset input ResetX and two data outputs DataO (0), DataO (1). Even though the inputs TMin and NAND-Treeout which are additionally present in accordance with the prior art are not present, the NAND tree test and the RAM test can be carried out as in accordance with the prior art. For this purpose, the invention necessitates an additional circuit in the ASIC, by means of which additional circuit an automatic state machine is constructed in this exemplary embodiment.

The data inputs Data (0) to Data (3) are connected to the inputs L1in of a logic circuit 1, to first inputs of a multiplexer circuit 6 consisting of four multiplexers and to four inputs of a NAND tree circuit 4 consisting of six NAND gates. The logic circuit 1 has four outputs L1out, which are connected to four second inputs of the multiplexer circuit 6. The four outputs of the multiplexer circuit 6 are connected to the inputs Adr, Din and R/Wb of a RAM 3, whose output Dout is connected to the input L2in of a further logic circuit 2. The outputs L2out of the further logic circuit 2 are connected to the second inputs of a further multiplexer circuit 7 whose outputs are connected to the ASIC outputs DataO (1) and DataO (0). The input for the system clock signal Clk is connected to the terminals Clk of the logic circuit 1 and of the further logic circuit 2 and to a fifth input of the NAND tree circuit 4. The reset input is connected to the reset inputs of the logic circuit 1 and of the further logic circuit 2 and to a sixth input of the NAND tree circuit 4. The inputs Clk and TMin of the automatic state machine 5 are respectively connected to the input for the system clock signal Clk and to the reset input ResetX. The output TMode of the automatic state machine 5 is in each case connected to a control input of the multiplexer circuit 6 and of the further multiplexer circuit 7.

The multiplexer circuits 6, 7 are each constructed in such a way that in each case one of their first inputs is connected to a first input of a multiplexer and one of their second inputs is connected to a second input of a multiplexer, the output of each multiplexer contained in the multiplexer circuit 6, 7 being connected in each case to an output of the respective multiplexer circuit 6, 7. A respective control input of the multiplexers, by means of which input one of the inputs can be connected to the output, is in each case connected to a control input of the respective multiplexer circuit 6, 7.

All of the inputs of the NAND tree circuit 4 are connected to a second input of one of the six NAND gates. The first input of the NAND gates of the NAND tree circuit 4 is respectively connected to the output of the preceding NAND gate, it being possible to set the first input of the first NAND gate to any desired potential, and the output of the last NAND gate being connected to a first input of the further multiplexer circuit 7. The output Dout of the RAM 3 is also connected to a first input of the further multiplexer circuit 7. The multiplexer circuit 6 and the further multiplexer circuit 7 respectively switch either their first inputs or their second inputs through to their outputs as a function of the control signal TMode, which is generated by the automatic state machine 5 and is applied via the respective control input to the multiplexer circuit 6, 7.

In this example, the ASIC, that is to say the two logic modules 1 and 2 of the ASIC, is reset in the event of the logic state "0" at the reset input.

The task of the automatic state machine is the decoding of a serial bit combination. If the bit combination has been identified, the automatic state machine changes to the test state and thereby switches the rest of the ASIC to the test state as well. Since the input TMin of the automatic state machine is in this case connected to the reset input ResetX, the serial bit combination which is present at the reset input ResetX is identified in this exemplary embodiment.

The automatic state machine comprises the following properties:

it does not have an asynchronous reset;

it reaches its state S0, when the ASIC is reset via the reset pin over a plurality of clock steps, after at least N clock steps;

the transition to the test state takes place only in the event of an active reset signal;

the leaving of the test state is carried out only in the event of an active reset signal;

it can assume at least three states.

Furthermore, all of its possible states should be defined.

Figure 3:
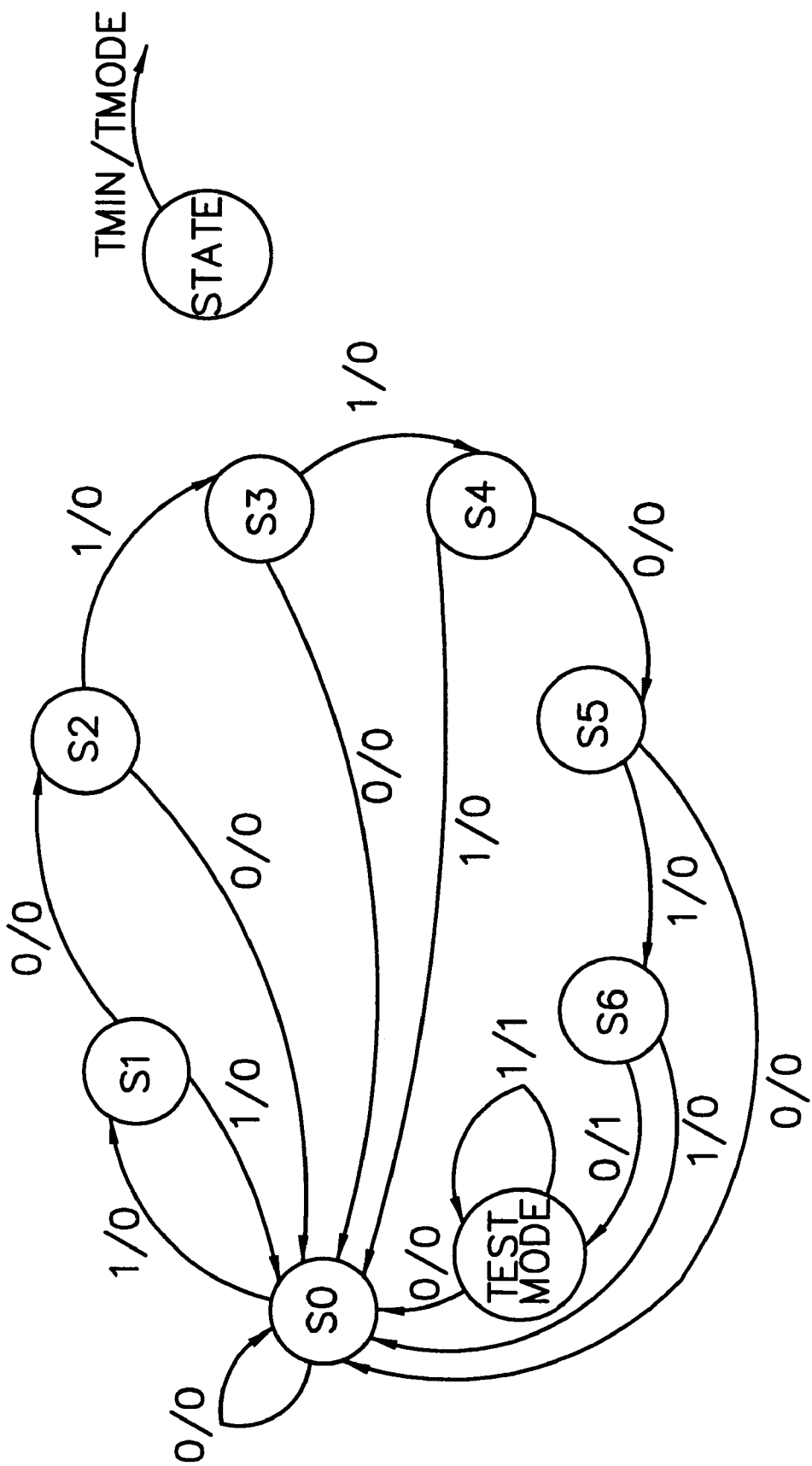
FIG. 3 shows a state diagram of an automatic state machine which can be incorporated in an ASIC according to the invention.

FIG. 3 shows a state diagram of the automatic state machine for the bit combination "001011010". In this case, the automatic state machine has eight states, which are designated by S0 to S6 and by Test mode. It changes its state whenever there is a rising clock signal.

If the automatic state machine is in the state S0 and a logic "0" is present at its input TMin, then it outputs a logic "0" at its output TMode and subsequently sets itself into the state S0 again. If a logic "1" is applied to the input TMin in this state, then it outputs a logic "0" at its output TMode and sets itself to the state S1. In the event of a logic "1" then present at the input TMin of the automatic state machine, the latter passes back into the state S0, whereas in the event of a logic "0" present at the input TMin, it passes into the state S2. The output signal TMode is logic "0" each time. From the state S2, the automatic state machine passes back into the state S0 given the presence of a logic "0", whereas it passes into the state S3 in the event of a logic "1" at the input TMin. The output signal TMode is logic "0" each time. From the state S3, the automatic state machine passes back into the state S0 in the event of a logic "0" present at the input TMin, whereas it passes into the state S4 in the event of a logic "1" present at the said input. A logic "0" is present at the output TMode for this case, too. From the state S4, the automatic state machine passes back into the state S0 in the event of a logic "1" then present at the input TMin, whereas it passes into the state S5 in the event of a logic "0" present at the input TMin. The output signal TMode of the automatic state machine is again logic "0" in this case, too. If a logic "0" is applied to the input TMin in the state S5, then the automatic state machine passes back into the state S0, whereas it passes into the state S6 in the event of a logic "1" at the input TMin. The output signal TMode is once again logic "0" for these cases, too. If, in the state S6, a logic "1" is applied to the input TMin of the automatic state machine, then the latter passes back into the state S0 in the event of a logic "0" at its output TMode. If, however, in the state S6, a logic "0" is applied to the input TMin of the automatic state machine, then the latter switches its output TMode to logic "1" and passes into the state Test mode. If a logic "1" is then applied to the input TMin of the automatic state machine in this state Test mode, then the output TMode remains at logic "1" and the automatic state machine sets itself back into the state Test mode. If, however, in the state Test mode, a logic "0" is applied to the input TMin of the automatic state machine, then the latter switches its output TMode to logic "0" and passes back into the state S0.

From this description of the state diagram of the automatic state machine, it becomes clear that the latter is in the state S0 at the latest after two clock steps in the event of a logic "0" at its input TMin. Afterwards, it is set by the bit combination "1011010" into the state Test mode, in which it is held in the event of a logic "1" at its input TMin. During the switch-over to the state Test mode, a logic "1" is output in each case at the output TMode of the automatic state machine. The state Test mode is left again as a result of a logic "0" at the input TMin of the automatic state machine. For the bit combination "001011010", therefore, the automatic state machine is in any event switched over to the state Test mode.

As a result of the logic "1" present at the output TMode of the automatic state machine in the state Test mode, the ASIC is switched over to the test state by switching over the respective multiplexers of the multiplexer circuit 6 and of the further multiplexer circuit 7.

Since the input TMin of the automatic state machine is connected to the reset input ResetX of the ASIC, it is also impossible for any unintentional switch-over of the automatic state machine to the test mode, and consequently unintentional switch-over of the ASIC to the test state, to take place, since the reset input is at the level logic "1" in the operating state and at the level "0" for a reset.

Furthermore, the ASIC can still properly be reset by means of a reset signal present at the reset input ResetX. The original function of the ASIC is therefore not impeded by the automatic state machine, which can switch the ASIC to the test state.

Figure 4:
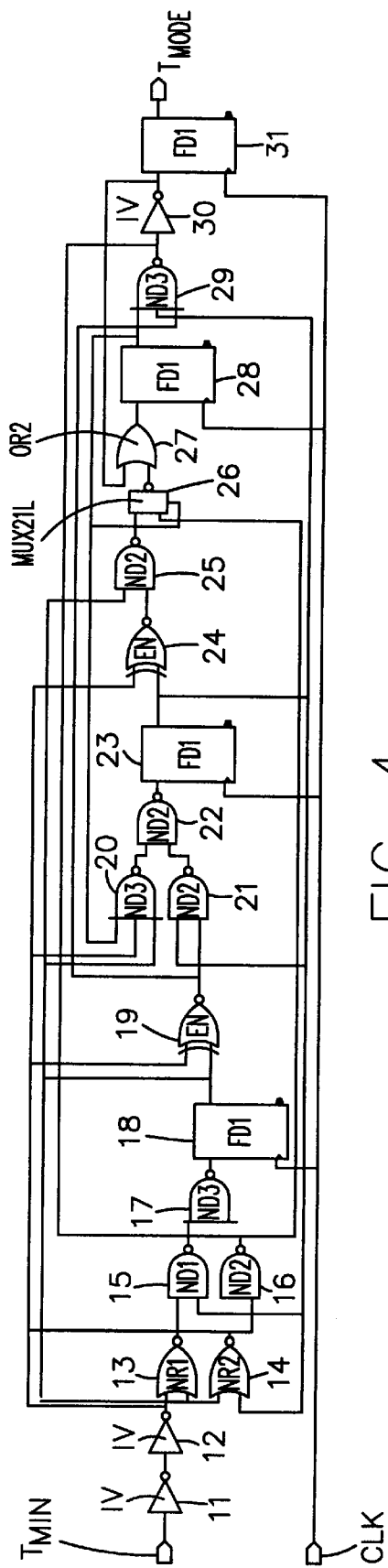
FIG. 4 shows a circuit diagram of an automatic state machine which operates in accordance with the state diagram of FIG. 3.

The circuit of the automatic state machine whose state diagram is illustrated in FIG. 3 is described below with reference to FIG. 4.

The input signal applied to the input terminal TMin is applied, via two invertors 11, 12, to an input terminal of a NOR gate 13, to an input terminal of a NAND gate 16, to an input terminal of an exclusive NOR gate 19, to an input terminal of a NAND gate 20 and to an input terminal of an exclusive NOR gate 24. The output of the NOR gate 13 is connected to an input of a NAND gate 15, whose output is in turn connected to an input of a NAND gate 17. The output of the NAND gate 17 is connected to the signal input of a flip-flop 18, whose output is connected to a second input of the exclusive NOR gate 19, to a second input of the NOR gate 13, to an input of a NOR gate 14, to a second input of the NAND gate 20 and to an input of a NAND gate 25. The output of the exclusive NOR gate 19 is connected to an input of a NAND gate 21 and to an input of a NAND gate 29. The output of the NAND gate 29 is connected to the input of an invertor 30 and to a second input of the NAND gate 17. The output of the invertor 30 is connected to the signal input of a flip-flop 31 and to an input of a NOR gate 27. The output of the NOR gate 27 is connected to a signal input of a flip-flop 28, whose output is connected to a third input of the NAND gate 29, to the control input of a multiplexer 26 and to a third input of the NAND gate 20. The output of the NAND gate 20 is connected to an input of a NAND gate 22, whose output is connected to the input of a flip-flop 23. The output of the flip-flop 23 is connected to the second input of the exclusive NOR gate 24, to a third input of the NAND gate 29, to a second input of the NAND gate 21, to a second input of the NAND gate 15, and to a second input of the NOR gate 14. The output of the NOR gate 14 is connected to a second input of the NAND gate 16, whose output is connected to a third input of the NAND gate 17 and to a first input of the multiplexer 26. The output of the NAND gate 21 is connected to a second input of the NAND gate 22. The output of the exclusive NOR gate 24 is connected to a second input of the NAND gate 25, whose output is connected to a second input of the multiplexer 26. The output of the multiplexer 26 is connected to a second input of the NOR gate 27. A system clock signal is fed to the clock inputs of the flip-flops 18, 23, 28 and 31 via the system clock input pin Clk. The output signal TMode of the automatic state machine is present at the output of the flip-flop 31.

Figure 5:
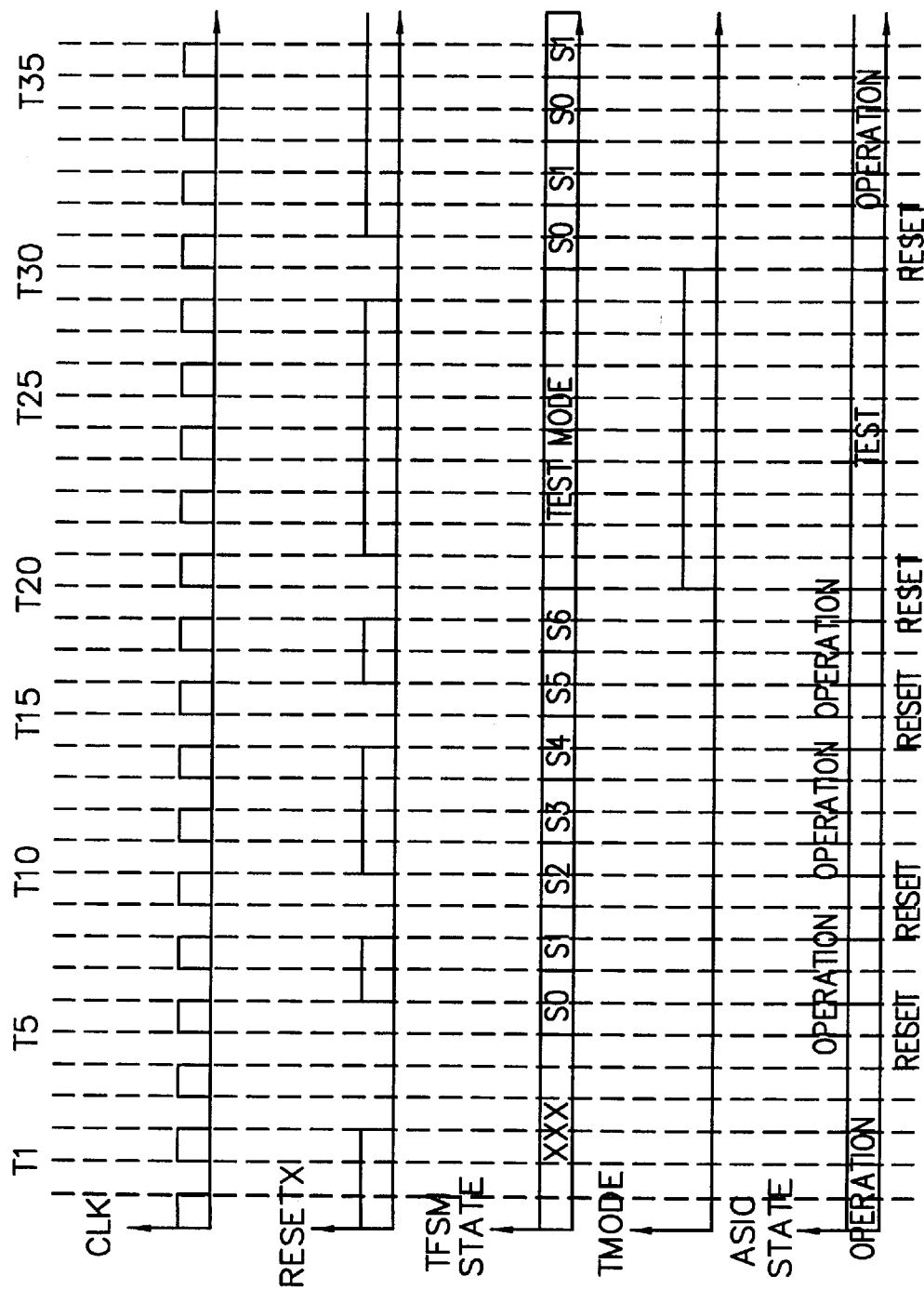
FIG. 5 shows a timing diagram which illustrates the states of the automatic state machine, of the output signal of the automatic state machine and of the state of the rest of the ASIC as a function of the system clock signal and of the reset signal.

FIG. 5 indicates the state of the ASIC, of the automatic state machine and of the output signal TMode of the automatic state machine as a function of the system clock signal present at the Clk pin and of the reset signal present at the ResetX pin.

The automatic state machine switches whenever there is a rising edge of the system clock signal Clk. This means that in the event of this edge of the system clock signal, the inputs which are in each case relevant to the automatic state machine are checked for their logic state and, accordingly, a state change of the automatic state machine can take place.

If the reset signal is at a logic level "0" at the instant T3, at which the system clock signal has a rising edge, and at the instant T5, at which the system clock signal has the next rising edge, then the automatic state machine switches to the state S0 at the instant T5. As a result of a corresponding logic state of the reset signal in each case at the instant of successive rising edges of the system clock signal, the automatic state machine passes via the states S1 to S6 into the state Test mode. Here, the ASIC is set to the test state by the change of the logic level of the TMode signal from logic "0" to logic "1". This test state is maintained for as long as the reset signal is at logic "1" or the system clock signal Clk does not have a rising edge. If the reset signal has the logic state "0" in the event of a rising edge of the system clock signal, then the automatic state machine switches back to the state S0, the output signal TMode of the automatic state machine changing to logic "0", as a result of which the state of the ASIC changes from the test state to the reset state. In the event of a reset signal having the logic level "1", the state of the ASIC is switched to the operating state and the state of the automatic state machine changes, in the event of each rising edge of the system clock signal, from the state S0 to the state S1, or vice versa.

In this way, using a functional pin at which, on account of its function, a control signal is present, it is possible to distinguish between this control signal and a further control signal which switches the ASIC to the test state.

Of course, for such a switch-over by a circuit which can distinguish between two different signals, it is also possible to use automatic state machines with other state transitions and a different bit pattern to be applied or other identification circuits which respond to non-digital control signals.

What is claimed is:

1. Integrated circuit, having
    data inputs and outputs (Data (0), Data (1), Data (2), Data (3), DataO (0), DataO (1)), and
    a control input (ResetX) for receiving a first control signal for the purpose of switching the integrated circuit over between an operating state and a test state,
    wherein all of said data inputs and said control input constitute a set of inputs to said integrated circuit, all the inputs of said set of inputs are employed during said operating state, and a signal format employed with inputs of said input set during said test state is employed also during said operating state,
    wherein the integrated circuit has an identification circuit which is connected to the control input (ResetX), distinguishes between the first control signal and a second control signal and switches the integrated circuit over between the operating state and the test state as a function of the first control signal.

2. Integrated circuit according to claim 1, wherein the control input (ResetX) is a reset input and the second control signal comprises information about setting and resetting circuit blocks of the integrated circuit.

3. Integrated circuit according to claim 1, wherein the identification circuit, in accordance with the first control signal, connects at least one of the data outputs (DataO (0), DataO (1)) to a first or second circuit block output (Dout, L2out).

4. Integrated circuit according to claim 1, wherein the identification circuit in accordance with the first control signal, connects the inputs (Adr, Din, R/Wb) of one circuit block (3) to the outputs (L1out) of another circuit block (1) or to the data inputs (Data (0), Data (1), Data (2), Data (3)).

5. Integrated circuit according to claim 3, the first circuit block output is the output (L2out) of a logic circuit and the second circuit block output is the output (Dout) of a mass storage device.

6. Integrated circuit according to claim 3, wherein the first circuit block output is the output (L2out) of a logic circuit (2) and the second circuit block output is the output (Nandtreeout) of a logic circuit (4) which checks at least the data inputs (Data (0), Data (1), Data (2), Data (3)).

7. Integrated circuit according to claim 6, wherein the logic circuit (4) which checks at least the data inputs (Data (0), Data (1), Data (2), Data (3)) is a Nandtree which checks all of the inputs (Data (0), Data (1), Data (2), Data (3), Clk, ResetX).

8. Integrated circuit according to claim 1, wherein the identification circuit is an automatic state machine.

9. Integrated circuit according to claim 8, wherein the automatic state machine receives a system clock signal.

10. Integrated circuit according to claim 8, wherein the first control signal is a bit pattern comprising a plurality of bits.

11. Integrated circuit according to claim 1, wherein the second control signal is a one-bit signal.

12. Integrated circuit according to claim 8, wherein the automatic state machine does not have an asynchronous reset.

13. Integrated circuit according to claim 8, wherein the automatic state machine can assume at least three states.

14. Integrated circuit according to claim 1, wherein the test state is attained in the event of an active reset signal.

15. Integrated circuit according to claim 1, wherein the test state is left in the event of an active reset signal.

16. Integrated circuit according to claim 1, wherein the integrated circuit is an application-specific integrated circuit.

17. Integrated circuit, comprising:
    data inputs and outputs (Data (0), Data (1), Data (2), Data (3), DataO (0), DataO (1)); and
    a control input (ResetX) for receiving a first control signal for the purpose of switching the integrated circuit over between an operating state and a test state;
    wherein all of said data inputs and said control input constitute a set of inputs to said integrated circuit, all the inputs of said set of inputs are employed during said operating state, and a signal format employed with inputs of said input set during said test state is employed also during said operating state;
    wherein the integrated circuit has an identification circuit which is connected to the control input (ResetX), distinguishes between the first control signal and a second control signal and switches the integrated circuit over between the operating state and the test state as a function of the first control signal; and
    wherein the first control signal is a bit pattern comprising a plurality of bits.

18. Integrated circuit, comprising:
    a plurality of data inputs and a plurality of data outputs; and
    a control input for receiving a control signal for the purpose of switching the integrated circuit over between an operating state and a test state, the control signal comprising a bit pattern having a plurality of bits;
    wherein all of said data inputs and said control input constitute a set of inputs to said integrated circuit, all the inputs of said set of inputs are employed during said operating state, and a signal format employed with inputs of said input set during said test state is employed also during said operating state;
    wherein the control input serving for receipt of the control signal also serves for receiving a further signal for operation of the integrated circuit during the operating state; and
    the integrated circuit has an identification circuit which is connected to the control input, distinguishes between the control signal and the further signal, and switches the integrated circuit over between the operating state and the test state in response to control signal.

* * * * *